(12) United States Patent
Kurokawa (10) Patent No.: US 8,704,578 B2
(45) Date of Patent: Apr. 22, 2014

(54) PROTECTION CIRCUIT

(75) Inventor: Tatsumfi Kurokawa, Kanagawa (JP)

(73) Assignee: Rensas Electronics Corporation, Kanagawa (JP)

( * ) Notice: Subject to any disclaimer, the term of this patent is extended or adjusted under 35 U.S.C. 154(b) by 40 days.

(21) Appl. No.: 13/468,810

(22) Filed: May 10, 2012

(65) Prior Publication Data

US 2012/0286843 A1 Nov. 15, 2012

(30) Foreign Application Priority Data

May 11, 2011 (JP) .................................. 2011-106177

(51) Int. Cl.
*H03L 5/00* (2006.01)
(52) U.S. Cl.
USPC ............ 327/318; 327/309; 327/320; 327/326
(58) Field of Classification Search
USPC ......... 327/309, 310, 314, 318–321, 325, 326; 361/90, 91.1, 91.5, 91.6
See application file for complete search history.

(56) References Cited

U.S. PATENT DOCUMENTS 7,408,396 B2 * 8/2008 El-Khoury et al. ........... 327/318

FOREIGN PATENT DOCUMENTS

| JP | 62-107527 U | 7/1987 |
| JP | 2010-111213 A | 5/2010 |

* cited by examiner

*Primary Examiner* — Long Nguyen
(74) *Attorney, Agent, or Firm* — Sughrue Mion, PLLC (57) ABSTRACT

A P-channel MOS transistor MP1 is provided between an input voltage Vin and the low-voltage circuit. The cathode of a first zener diode Z1 is connected to a node between the input voltage Vin and the source of the P-channel MOS transistor MP1. The anode of the first zener diode Z1 is branched into two lines at a branch node N1, and one of the two lines is connected to a ground through a resistor R1. The other of the two lines is connected to the gate of the P-channel MOS transistor MP1. The cathode of a second zener diode Z2 is connected to a node between the low-voltage circuit and the drain of the P-channel MOS transistor MP1. The anode of the second zener diode Z2 is connected to a ground.

4 Claims, 10 Drawing Sheets

PROTECTION CIRCUIT

CROSS-REFERENCE TO RELATED APPLICATIONS

This application is based upon and claims the benefit of priority from Japanese patent application No. 2011-106177, filed on May 11, 2011, the disclosure of which is incorporated herein in its entirety by reference.

BACKGROUND

The present invention relates to a protection circuit that protects a circuit from an overvoltage.

When a voltage higher than the withstand voltage is accidentally applied to circuit components used in semiconductor integrated circuits, they could function improperly, and even be permanently destroyed in the worst case. Therefore, such semiconductor integrated circuits are provided with protection circuits to protect them from an overvoltage. Patent literature 1 (Japanese Unexamined Patent Application Publication No. 2010-111213) discloses such a protection circuit.

Figure 10:
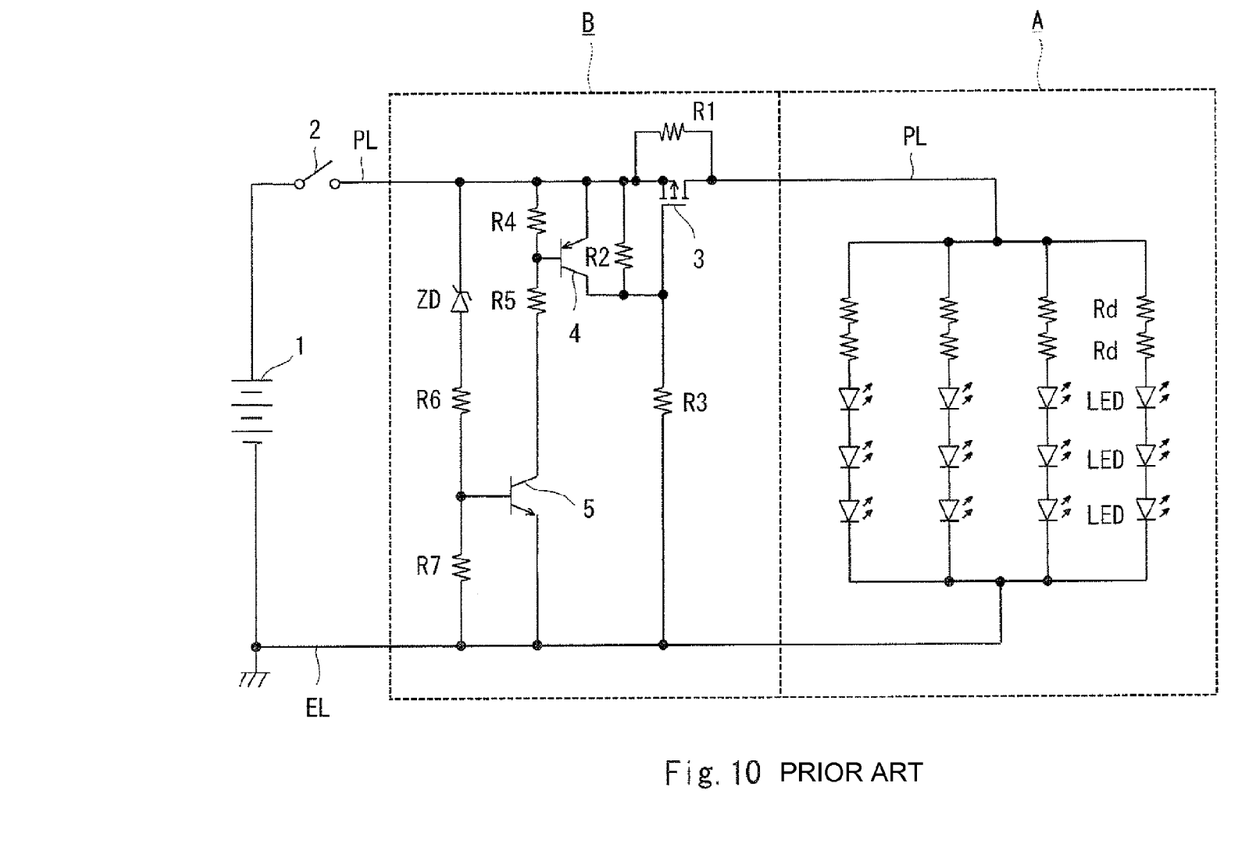
FIG. 10 shows a related art.

FIG. 10 shows an overvoltage protection circuit disclosed in Patent literature 1. In FIG. 10, an overvoltage protection circuit B is provided to prevent an overvoltage from being applied to a circuit A to be protected. In a normal operation, a voltage applied from a battery power supply 1 is applied to the circuit A to be protected through a switch 2 and a P-channel MOS transistor 3.

If the battery power supply 1 generates an overvoltage, it exceeds the breakdown voltage of a zener diode ZD and a breakdown current thereby flows through the zener diode ZD. As a result, a voltage at the base of an NPN transistor 5 is raised by resistors R6 and R7, and the impedance between the collector and emitter of the NPN transistor 5 is thereby lowered. Then, a voltage at the base of a PNP transistor 4 is lowered by resistors R4 and R5, and the impedance between the collector and emitter of the PNP transistor 4 is thereby lowered.

As a result, the P-channel MOS transistor 3 becomes an Off state. At this point, a voltage is applied to the circuit A to be protected through a surge protection resistor R1. A surge generated in the battery power supply 1 is consumed by the surge protection resistor R1 and the circuit to be protected located behind the surge protection resistor R1 is thereby protected from the overvoltage.

Meanwhile, Patent literature 2 (Japanese Unexamined Utility Model Application Publication No. 62-107527) discloses a surge absorber circuit that prevents a surge current caused in a load side from flowing backward to external circuits.

SUMMARY

However, in the configuration disclosed in Patent literature 1, when an abnormality occurs in the battery power supply 1, the voltage applied to the circuit A to be protected is determined based on the divided voltage between the surge protection resistor R1 and the circuit A to be protected. Therefore, when the overvoltage of the battery power supply 1 is too high and the electric power cannot be sufficiently consumed by the surge protection resistor R1, there is a possibility that the circuit A to be protected cannot be sufficiently protected. On the other hand, when the overvoltage of the battery power supply 1 is not so high, the voltage supplied to the circuit A to be protected is lowered so much that there is a possibility that the operation of the circuit A to be protected is stopped.

Note that in the configuration disclosed in Patent literature 2, although the current is limited, the voltage cannot be limited. Therefore, if an overvoltage having a DC voltage characteristic occurs, the voltage cannot be limited.

A first aspect of the present invention is a protection circuit provided between a power supply and a circuit to be protected from a surge voltage, including: a current limit circuit provided between the power supply and the circuit to be protected; a voltage detection circuit provided between the current limit circuit and the power supply, the voltage detection circuit being configured to limit a current flowing through the current limit circuit when the voltage detection circuit detects that a voltage from the power supply is equal to or greater than a predetermined voltage value; and a voltage limit circuit provided between the current limit circuit and the circuit to be protected, the voltage limit circuit being configured to limit a voltage applied to the circuit to be protected to or below a predetermined value, wherein the protection circuit is configured such that when the voltage from the power supply is equal to or greater than the predetermined voltage value, a value of the current flowing through the current limit circuit is adjusted to or below a permissible current of the voltage limit circuit.

With the above-described configuration, even if an overvoltage equal to or higher than a predetermined voltage value is caused from the power supply, it is possible to prevent this overvoltage from being applied to the circuit to be protected and to continue the operation of the circuit to be protected.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

First Embodiment

Figure 1:
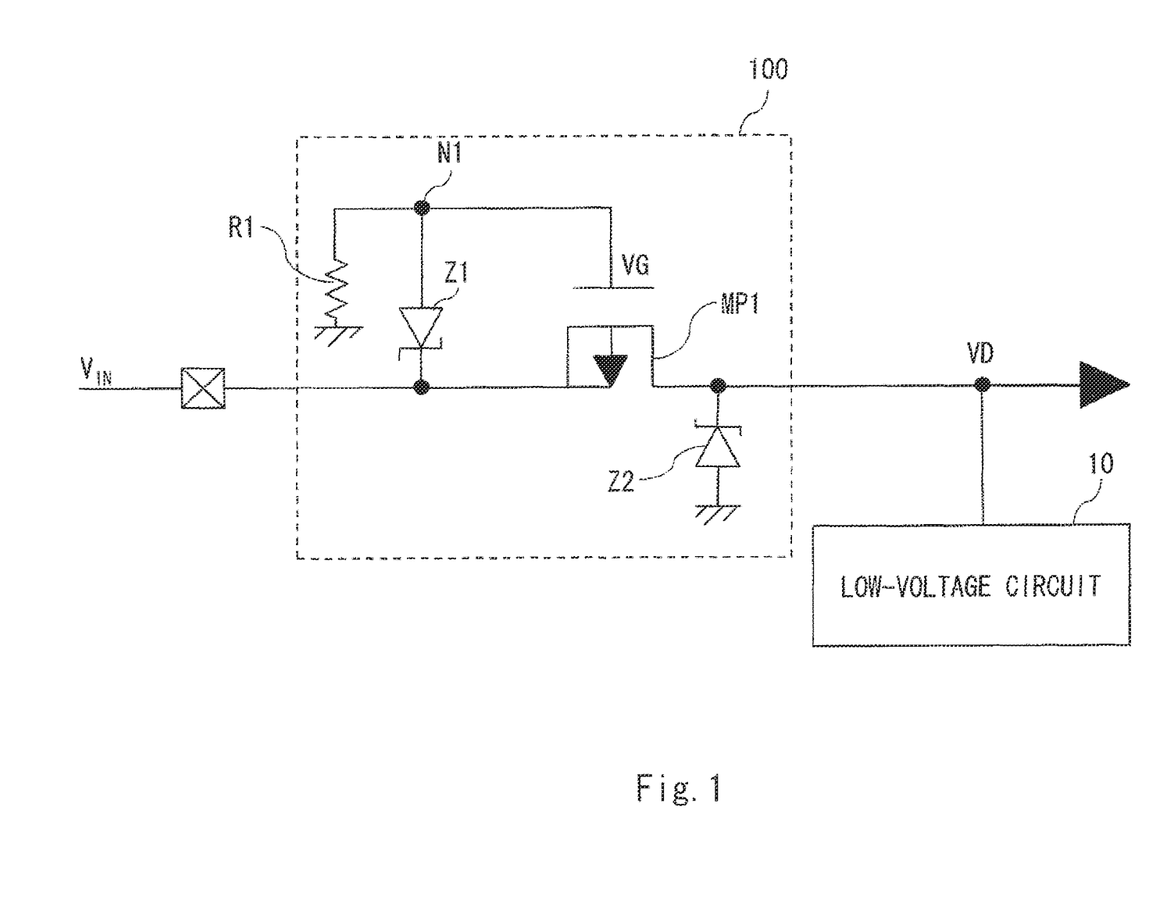
FIG. 1 shows a protection circuit 100 according to a first embodiment.

FIG. 1 shows a protection circuit 100 according to a first embodiment. The protection circuit 100 is provided between an input power supply (Vin) and a low-voltage circuit 10, i.e., a circuit to be protected. Then, when a problem such as an overvoltage occurs in the input power supply Vin, the protection circuit 100 protects the low-voltage circuit 10 from the surge voltage. Firstly, a circuit configuration of the protection circuit 100 is explained.

The protection circuit 100 includes a P-channel MOS transistor (a current limit circuit) MP1, a first zener diode (a voltage detection circuit) Z1, a first resistor R1, and a second zener diode (a voltage limit circuit) Z2.

The P-channel MOS transistor MP1 is disposed between the input power supply Vin and the low-voltage circuit 10. More specifically, the source of the P-channel MOS transistor MP1 is connected to the input power supply Vin side and the drain is connected to the low-voltage circuit 10 side.

The cathode of the first zener diode Z1 is connected to a node between the input power supply Vin and the source of the P-channel MOS transistor MP1. The anode of the first zener diode Z1 is branched into two lines at a branch node N1, and one of the two lines is connected to the ground through a resistor R1. The other of the two lines is connected to the gate of the P-channel MOS transistor MP1.

The cathode of the second zener diode Z2 is connected to a node between the low-voltage circuit 10 and the drain of the P-channel MOS transistor MP1. Further, the anode of the second zener diode Z2 is connected to the ground.

An operation of the protection circuit 100 having the above-described configuration is explained hereinafter.

(When Input Voltage has Normal Value)

Figure 2:
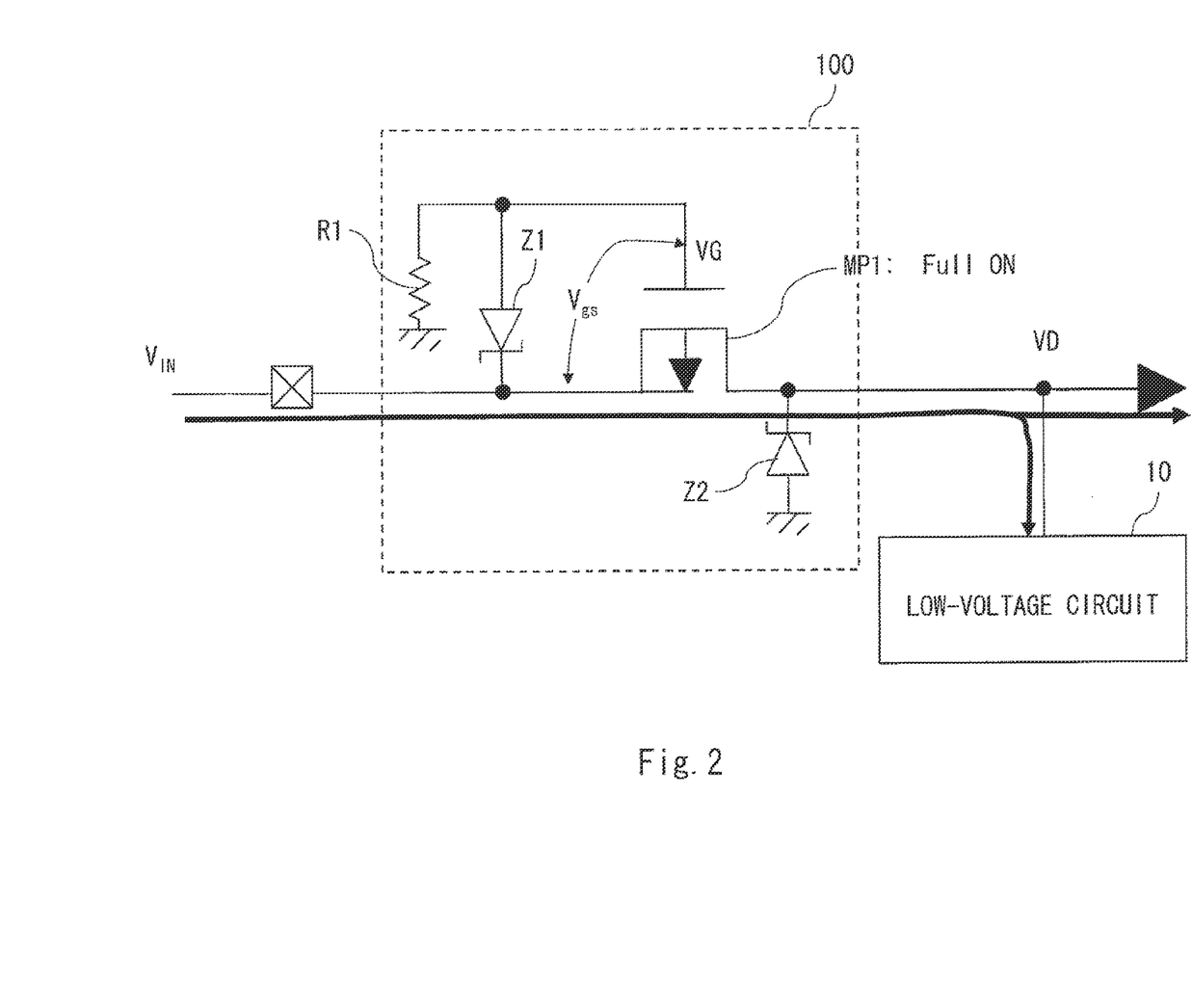
FIG. 2 is a diagram for explaining an operation of a protection circuit when an input voltage has a normal value.

Firstly, an operation of the protection circuit 100 in a state where the input voltage Vin from the input power supply is properly regulated and the input voltage Vin thereby has a normal value is explained with reference to FIG. 2. When the input voltage Vin has a normal value, the voltage level of the input voltage Vin is lower than the breakdown voltage of the first zener diode Z1 and the second zener diode Z2. Therefore, no current flows through the first zener diode Z1 and the second zener diode Z2.

Since no current flows through the first zener diode Z1, the gate voltage VG of the P-channel MOS transistor MP1 becomes to the ground power supply level. Therefore, the P-channel MOS transistor MP1 becomes a completely On state. As a result, the voltage input to the low-voltage circuit 10 becomes substantially equal to the input power supply voltage Vin.

(When Overvoltage Occurs)

Figure 3:
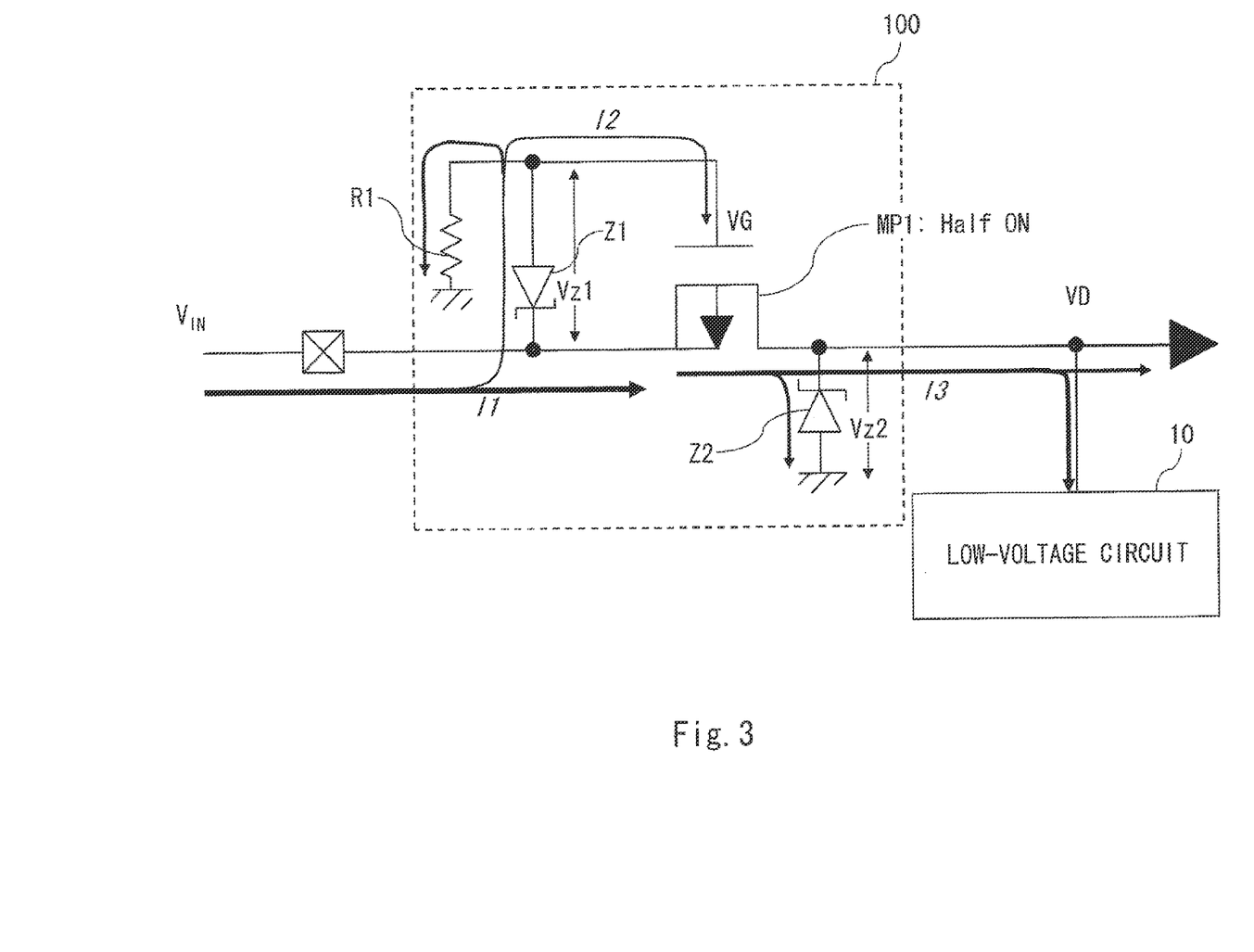
FIG. 3 is a diagram for explaining an operation of a protection circuit when an overvoltage occurs in an input voltage Vin.
Figure 4:
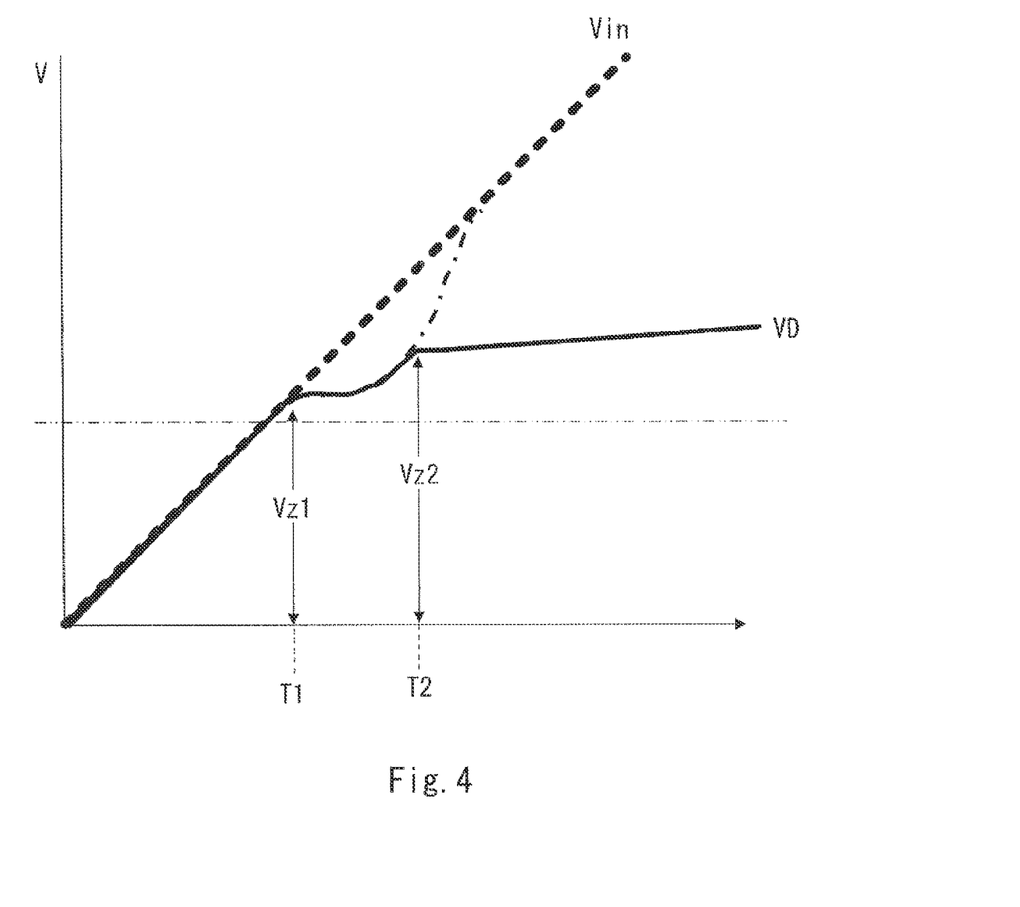
FIG. 4 is a diagram for explaining an operation of a protection circuit when an overvoltage occurs in an input voltage Vin.

Next, an operation of the protection circuit in a state where an overvoltage occurs and the input voltage Vin is raised to or above a predetermined voltage value due to some trouble occurring in the input power supply is explained with reference to FIGS. 3 and 4. When an overvoltage occurs in the input voltage Vin, the voltage level of the input voltage Vin rises and exceeds the breakdown voltage of the first zener diode Z1 and the second zener diode Z2.

More specifically, when the input voltage Vin rises, the first zener diode Z1 first responds to it and causes a breakdown. As a result, the input voltage VD to the low-voltage circuit 10 is suppressed to the breakdown voltage of the first zener diode Z1 (see timing T1 in FIG. 4).

When the first zener diode Z1 causes a breakdown, a current flows through the first zener diode Z1 and the gate voltage VG of the P-channel MOS transistor MP1 rises.

At this point, a relation "VG≈Vin−Vz1" is satisfied. Further, the voltage Vgs between the gate and source of the P-channel MOS transistor MP1 becomes VG≈Vin and is maintained at the fixed voltage even when the input voltage Vin rises. As a result, the P-channel MOS transistor MP1 changes from the completely On state to a half On state and the current I3 flowing through the P-channel MOS transistor MP1 is thereby limited.

Figure 5:
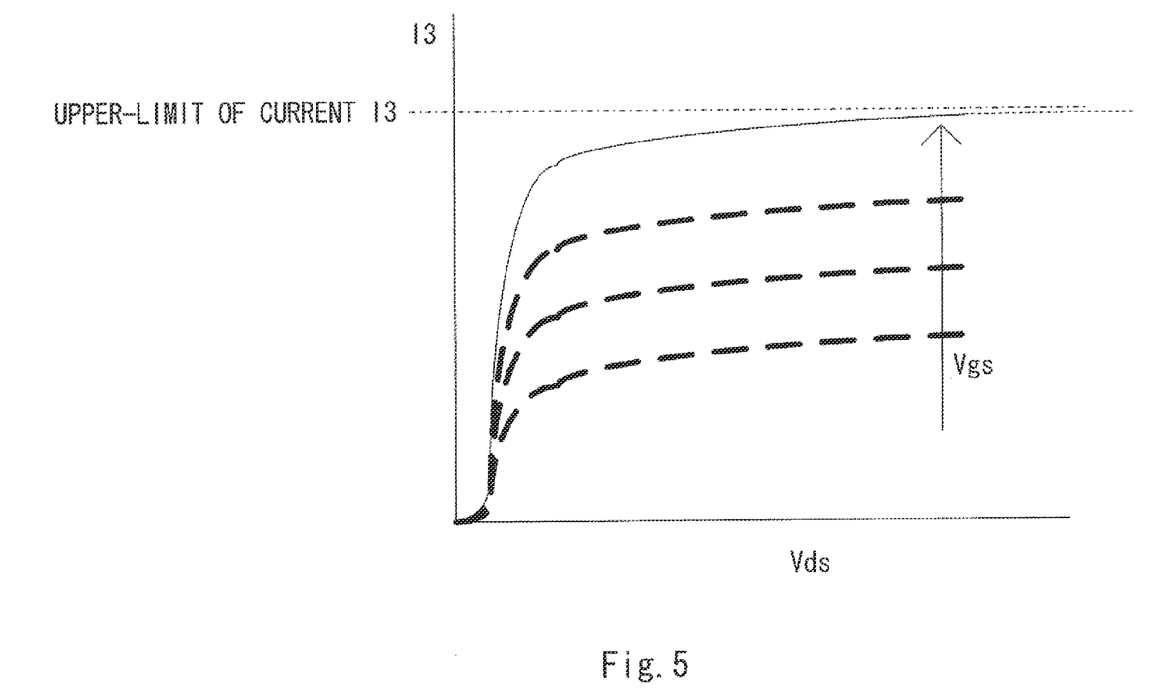
FIG. 5 shows a relation between gate voltages of a P-channel MOS transistor and limiting currents.

FIG. 5 shows the above-described relation. That is, when the input voltage Vin continues to rise, the voltage Vds between the drain and the source of the P-channel MOS transistor MP1 rises as a matter of course. However, since the gate-source voltage Vgs is limited to Vgs≈Vz1, the current I3 flowing through the P-channel MOS transistor MP1 is limited to a certain upper-limit value irrespective of the increase in the input voltage Vin as shown in FIG. 5.

Assume that the input voltage Vin continues to rise even further. When the input voltage Vin continues to rise even further, the input voltage VD to the low-voltage circuit 10 rises and gradually approaches to the input voltage Vin, i.e., to the overvoltage. However, when the input voltage VD to the low-voltage circuit 10 exceeds the breakdown voltage of the second zener diode Z2, the second zener diode Z2 responds to it and causes a breakdown. As a result, the input voltage VD to the low-voltage circuit 10 is suppressed to the breakdown voltage of the second zener diode Z2 (see timing T2 in FIG. 4).

It should be noted that, in zener diodes, when the current exceeds the permissible voltage, the voltage rises above the breakdown voltage. Therefore, when the input voltage Vin continues to rise, the input voltage VD of the low-voltage circuit 10 exceeds the breakdown voltage of the second zener diode Z2 and gradually approaches to the input voltage Vin, i.e., to the overvoltage (see FIG. 4).

Figure 6:
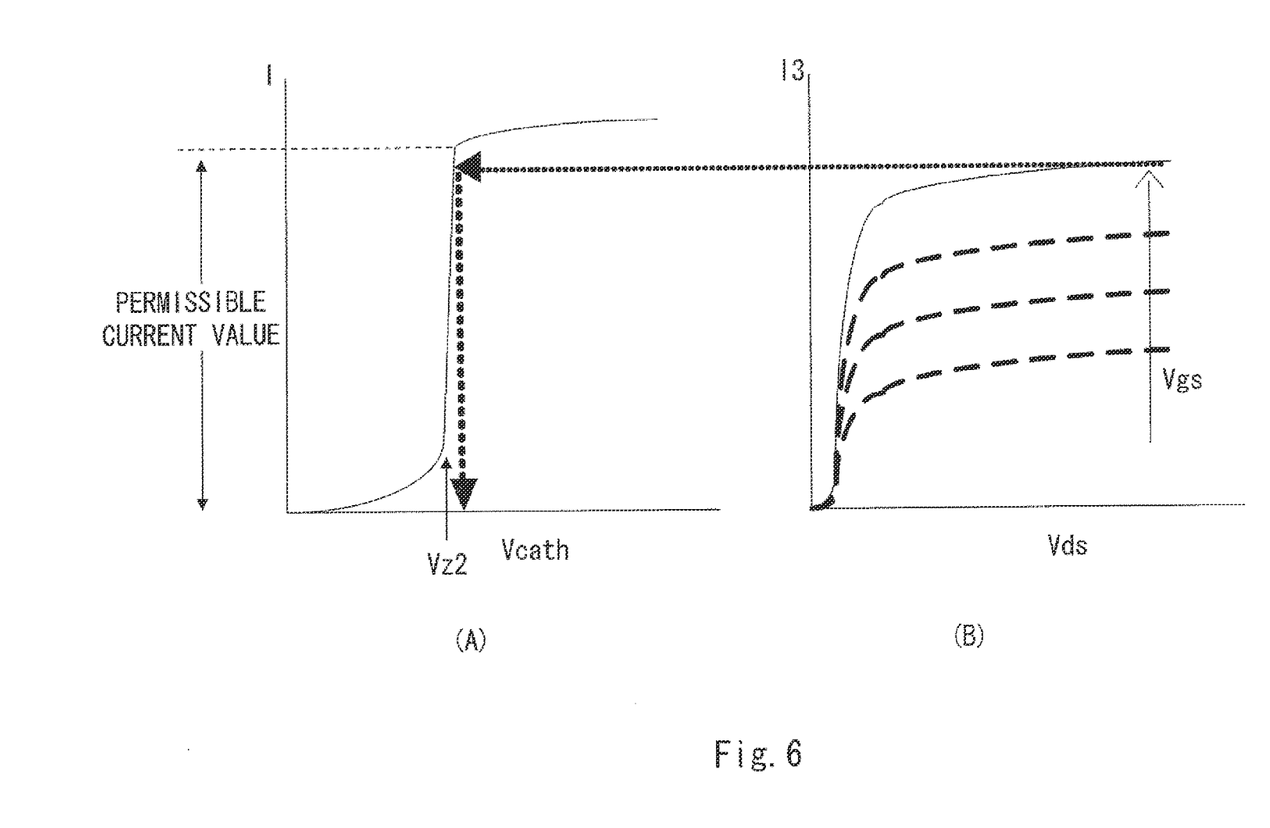
FIG. 6 shows a relation between upper-limit values of a current flowing a P-channel MOS transistor and permissible current values of a second zener diode.

For this matter, since the current I3 flowing through the P-channel MOS transistor MP1 is limited in this embodiment, it is possible to sufficiently suppress the input voltage VD to the low-voltage circuit 10 by making such an adjustment that this current I3 becomes smaller than the permissible current of the second zener diode Z2 in advance. That is, as described previously, the current I3 flowing through the P-channel MOS transistor MP1 is suppressed to a fixed upper-limit value irrespective of the input voltage Vin. Therefore, as shown in FIG. 6, the protection circuit is configured such that the upper-limit value of the current I3 flowing through the P-channel MOS transistor MP1 does not exceeds the permissible current value of the second zener diode Z2. In this manner, it is possible to suppress the input voltage VD of the low-voltage circuit 10 to VD≈Vz2.

In this state, the input voltage VD of the low-voltage circuit can be suppressed to a fixed value. Further, since no current path is cut off, the low-voltage circuit 10 continues the normal operation. As described above, the protection circuit 100 according to this embodiment can reliably protect the low-voltage circuit 10 and allow the low-voltage circuit 10 to continue operating even when an overvoltage occurs.

Note that it is possible to allow the first zener diode Z1 and the second zener diode Z2 to cause breakdowns substantially at the same instant by using a P-channel MOS transistor MP1 having a low resistance.

Second Embodiment

Figure 7:
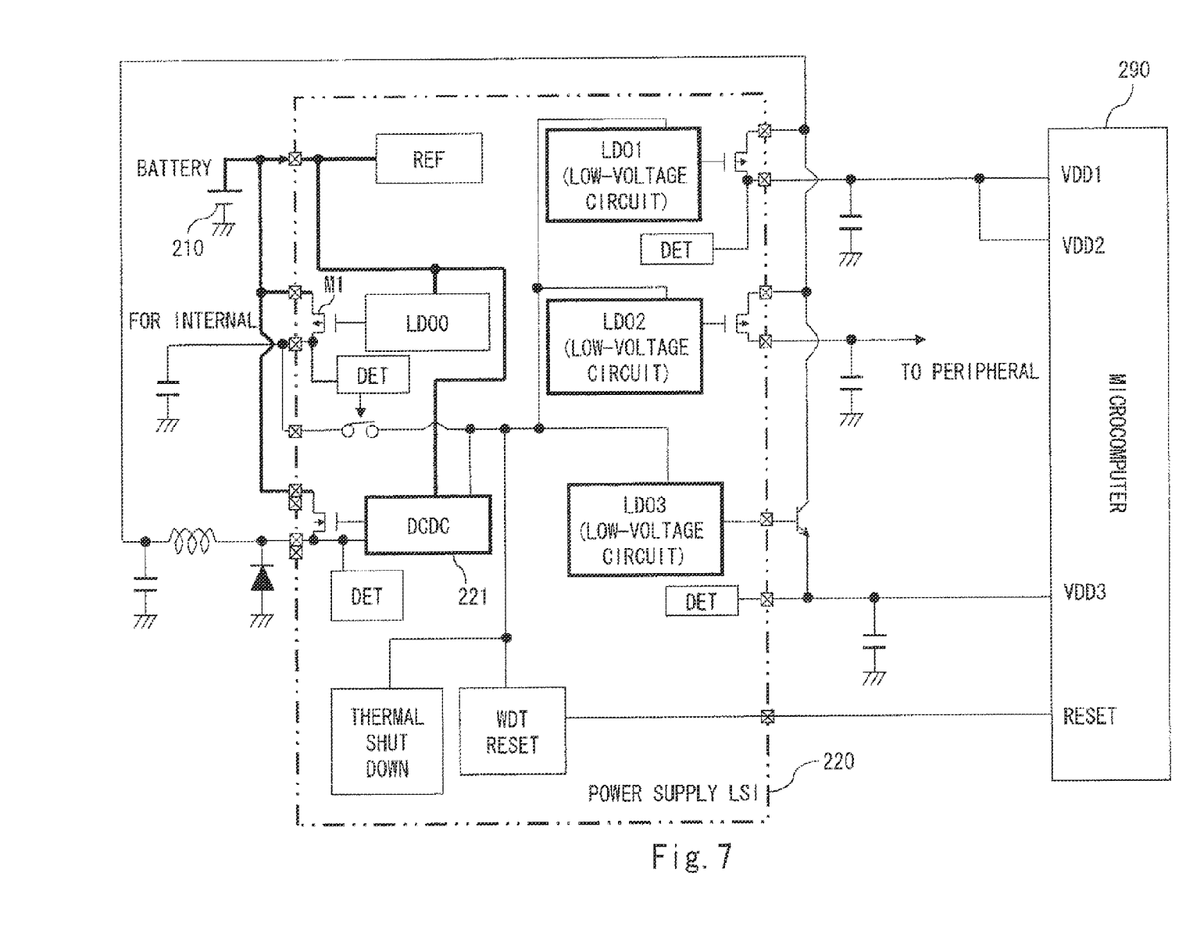
FIG. 7 is a diagram for explaining an application example of a protection circuit.

As a second embodiment, an application example of the protection circuit according to the above-described first embodiment is briefly introduced. FIG. 7 shows an example where a microcomputer 290 is operated by using electric power supplied from a high-voltage battery 210 as the power supply for operation. Such configurations may be used, for example, when a vehicle-mounted microcomputer 290 is operated by using the battery 210 of the vehicle. While the output voltage of the battery 210 is high, e.g., 14 V, the input voltage range of the microcomputer 290 is around 5 V. Therefore, it is necessary to use a power supply LSI 220 that generates electric power for the microcomputer 290 between the battery 210 and the microcomputer 290.

The power supply LSI 220 lowers the output voltage of the battery power supply from 14 V to 6 V by using a voltage-lowering DC-DC converter 221, and then generates an input voltage for the microcomputer such as 5 V and 1.2 V by using LDO (Low Dropout) regulators (LDO1, LDO2 and LDO3) Note that in order to reduce the size of the power supply LSI 220 and thereby to increase the packing density, it is desirable to form each of LDO1, LDO2 and LDO3 by using low-withstand-voltage transistors rather than using high-withstand-voltage transistors.

To make it possible to use low-withstand-voltage LDO1, LDO2 and LDO3, an LDO (Low Dropout) regulator LDO0 is provided to generate the electric power for these low-voltage circuits. The power supply voltage Vin for the low-voltage circuits (LDO1, LDO2 and LDO3) is generated by regulating the transistor M1 by using this LDO (Low Dropout) regulator LDO0.

Figure 8:
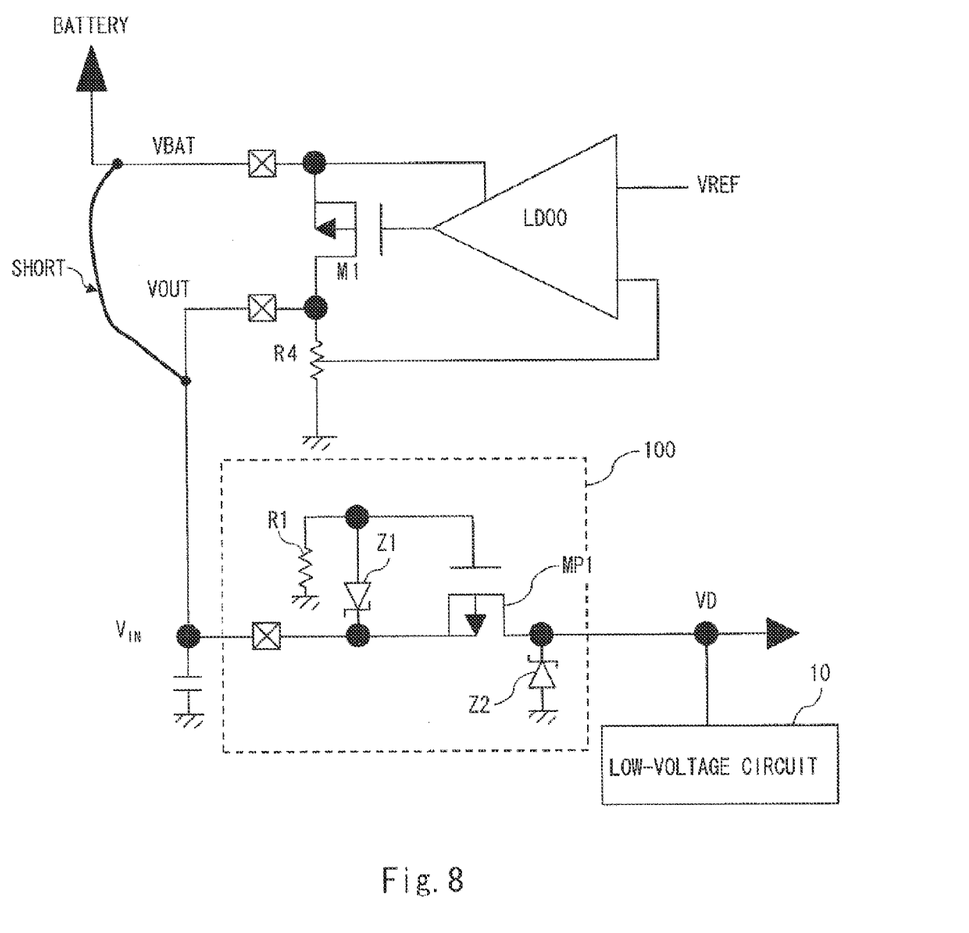
FIG. 8 shows an example in which a high voltage is applied due to a short-circuit.

However, as shown in FIG. 8, there is a possibility that the high voltage from the battery power supply flows directly to the low-voltage circuit 10 due to the occurrence of a short-circuit. Therefore, a protection circuit 100 according to an aspect of the present invention is provided in front of the low-voltage circuit 10. In this manner, owing to the above-described effect of the protection circuit 100, it is possible to protect the low-voltage circuit 10 and to allow the low-voltage circuit 10 to continue operating. As a result, the microcomputer 290 shown in FIG. 7 can also continue operating.

Figure 9:
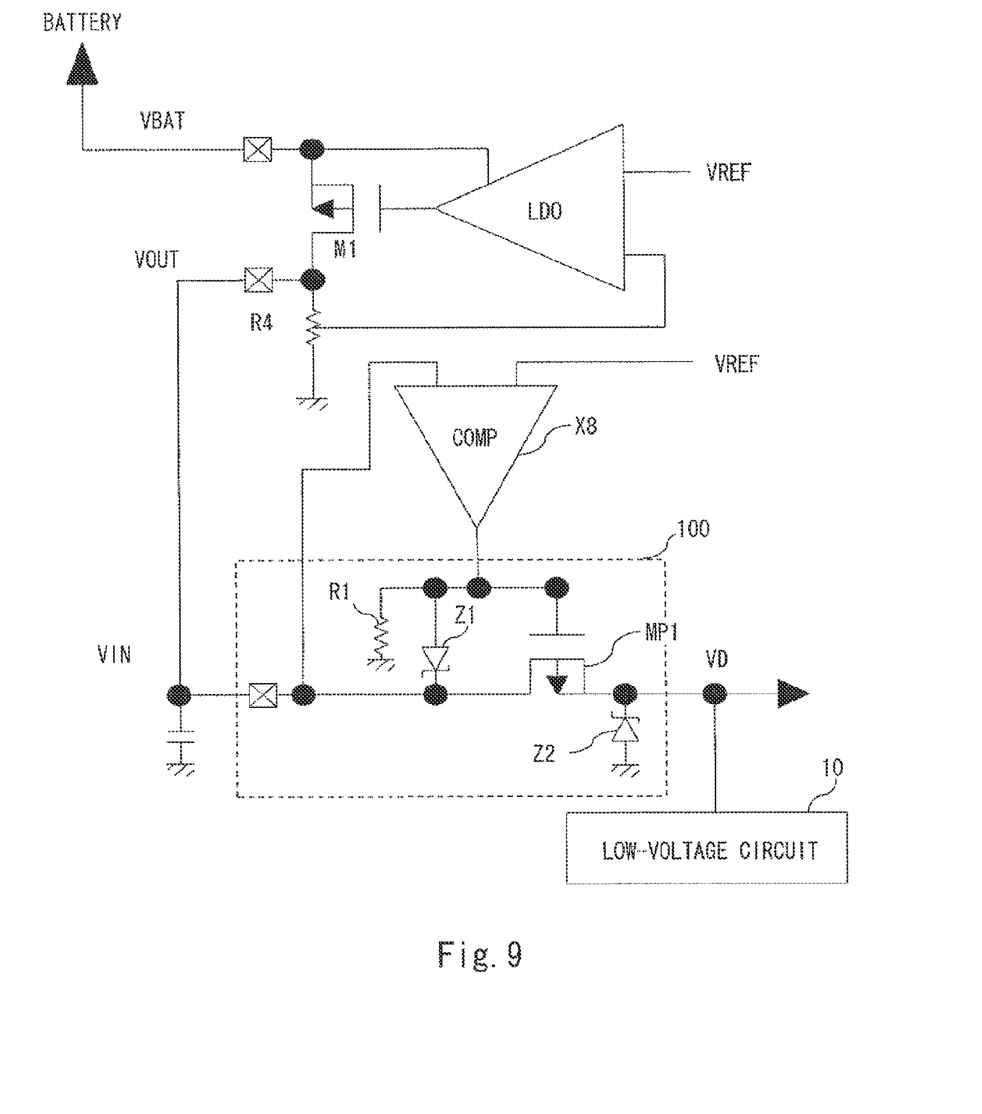
FIG. 9 shows a circuit in which a comparator X8 is provided.

Further, as shown in FIG. 9, a comparator (a cut-off circuit) X8 that is used to bring the P-channel MOS transistor MP1 into an Off state when an overvoltage occurs may be provided. The comparator X8 compares the input voltage Vin with a reference voltage Vref. Then, when the input voltage Vin becomes an overvoltage, the comparator X8 outputs a control signal to bring the P-channel MOS transistor MP1 into an Off state. Even in this case, it is meaningful to provide a protection circuit according to an aspect of the present invention. Since the operation of the comparator X8 takes time, there is a possibility that an overvoltage flows into the low-voltage circuit 10 in a period between when the overvoltage occurs and when the comparator X8 brings the P-channel MOS transistor MP1 into an Off state. For this matter, since the protection circuit 100 according to an aspect of the present invention operates quickly, it is possible to reliably protect the low-voltage circuit 10.

It should be noted that the present invention is not limited to the above-described embodiments and they can be modified as appropriate without departing from the scope and spirit of the present invention.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A protection circuit provided between a power supply and a circuit to be protected to protect the circuit to be protected from a surge voltage, the protection circuit comprising:
    a p-channel transistor including a source coupled to the power supply and coupled to a backgate thereof, a drain coupled to the circuit to be protected, and a gate;
    a first zener diode that causes a breakdown when a voltage from the power supply rises to or above a breakdown voltage, a cathode of the first zener diode being connected to the source of the p-channel transistor, and an anode of the first zener diode being connected to the gate of the p-channel transistor;
    a second zener diode, a cathode of the second zener diode being connected to the drain of the p-channel transistor, and an anode of the second zener diode being connected to a ground; and
    a resistor connected between the gate of the p-channel transistor and the ground.

2. The protection circuit according to claim 1, wherein the protection circuit is configured such that when the first zener diode causes a breakdown, the p-channel transistor becomes a half On state and a current flowing through the p-channel transistor becomes equal to or below a permissible current of the second zener diode.

3. The protection circuit according to claim 1, wherein the power supply is a direct-current power supply.

4. The protection circuit according to claim 1, further comprising:
    a cut-off circuit that brings the p-channel transistor into an Off state by applying a voltage signal to the gate of the p-channel transistor when a voltage from the power supply becomes equal to or above a predetermined voltage value.

* * * * *

UNITED STATES PATENT AND TRADEMARK OFFICE
CERTIFICATE OF CORRECTION

PATENT NO. : 8,704,578 B2  
APPLICATION NO. : 13/468810  
DATED : April 22, 2014  
INVENTOR(S) : Tatsufumi Kurokawa Page 1 of 1

It is certified that error appears in the above-identified patent and that said Letters Patent is hereby corrected as shown below:

On the Title Page

Column 1 Item (75) (Inventors), Line 1: Delete "Tatsumfi" and insert -- Tatsufumi --

Column 1 Item (73) (Assignee), Line 1: Delete "Rensas" and insert -- Renesas --

Signed and Sealed this
Twenty-first Day of October, 2014

Michelle K. Lee
*Deputy Director of the United States Patent and Trademark Office*